(12) United States Patent
Kikuchi

(10) Patent No.: US 7,851,351 B2
(45) Date of Patent: Dec. 14, 2010

(54) MANUFACTURING METHOD FOR SEMICONDUCTOR DEVICES WITH ENHANCED ADHESIVITY AND BARRIER PROPERTIES

(75) Inventor: Yoshiyuki Kikuchi, Nirasaki (JP)

(73) Assignee: Tokyo Electron Limited, Minato-ku (JP)

( * ) Notice: Subject to any disclaimer, the term of this patent is extended or adjusted under 35 U.S.C. 154(b) by 203 days.

(21) Appl. No.: 12/157,795

(22) Filed: Jun. 13, 2008

(65) Prior Publication Data
US 2008/0246125 A1    Oct. 9, 2008

(30) Foreign Application Priority Data
Mar. 31, 2006   (JP)  ............................. 2006-099770
Mar. 27, 2007   (WO) ................ PCT/JP2007/056447
Mar. 30, 2007   (TW)  ............................... 96111350 A

(51) Int. Cl.
*H01L 21/4763*   (2006.01)
(52) U.S. Cl. ...................... 438/627; 438/643; 438/653; 438/761; 438/E23.154
(58) Field of Classification Search ......... 438/761–765, 438/627–628, 643–654
See application file for complete search history.

(56) References Cited

U.S. PATENT DOCUMENTS 6,429,518 B1 *   8/2002   Endo ........................... 257/753

FOREIGN PATENT DOCUMENTS

| CN | 1182956 A | 5/1998 |
|---|---|---|
| CN | 1106030 C | 4/2003 |
| JP | 2005-302811 A | 10/2005 |
| WO | WO 2000/021124 A1 | 4/2000 |
| WO | WO 2000/054329 A1 | 9/2000 |
| WO | WO 2005/069367 A1 | 7/2005 |

OTHER PUBLICATIONS

Text of the first offive action the merits (China) mailed on Oct. 23, 2009 Appl.No. 2007800013688, Examiner:Xu Guoliang, 2pgs.

* cited by examiner

*Primary Examiner*—Dung A. Le
(74) *Attorney, Agent, or Firm*—Masuvalley & Partners

(57) ABSTRACT

A method for manufacturing semiconductor devices includes the steps of; forming an insulating film comprising a fluorine added carbon film on a substrate; forming a first barrier layer comprising a silicon nitride film on the insulating film by exposing a surface of the substrate formed with the insulating film to a plasma containing each active specie of a silicon and a nitride; forming a second barrier layer comprising a film containing silicon, carbon, and nitride on the first barrier layer by exposing a surface of the substrate formed with the first barrier layer to a plasma containing each active specie of the silicon and a carbon; and forming a film containing silicon and oxygen on the second barrier layer by exposing a surface of the substrate formed with the second barrier layer to a plasma containing each active specie of the silicon and an oxygen.

2 Claims, 11 Drawing Sheets

Fig. 9
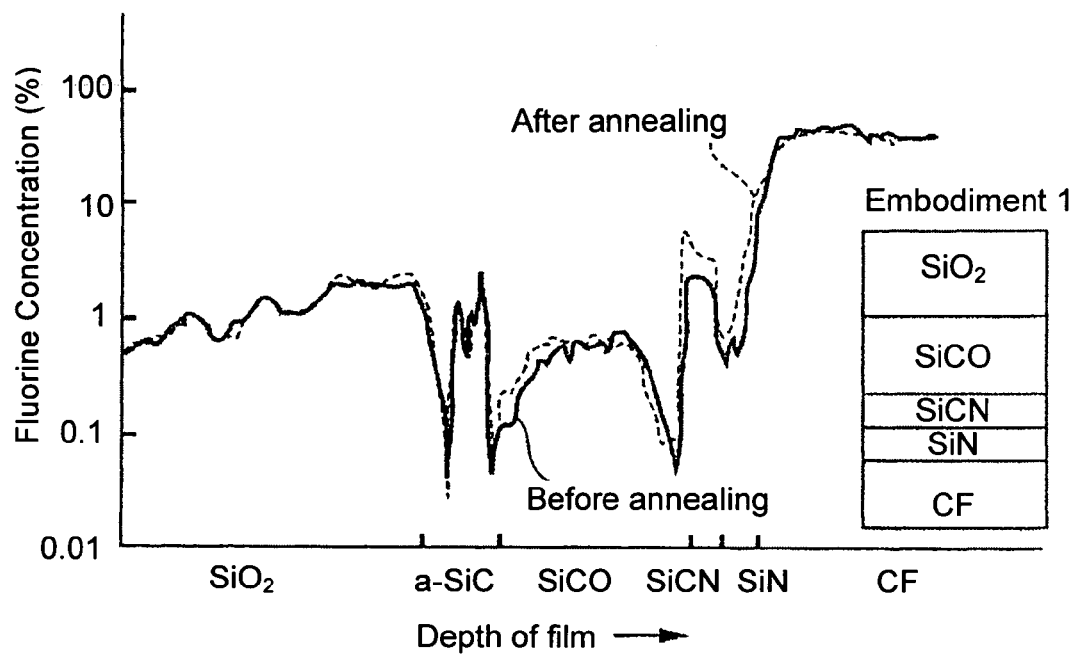
A
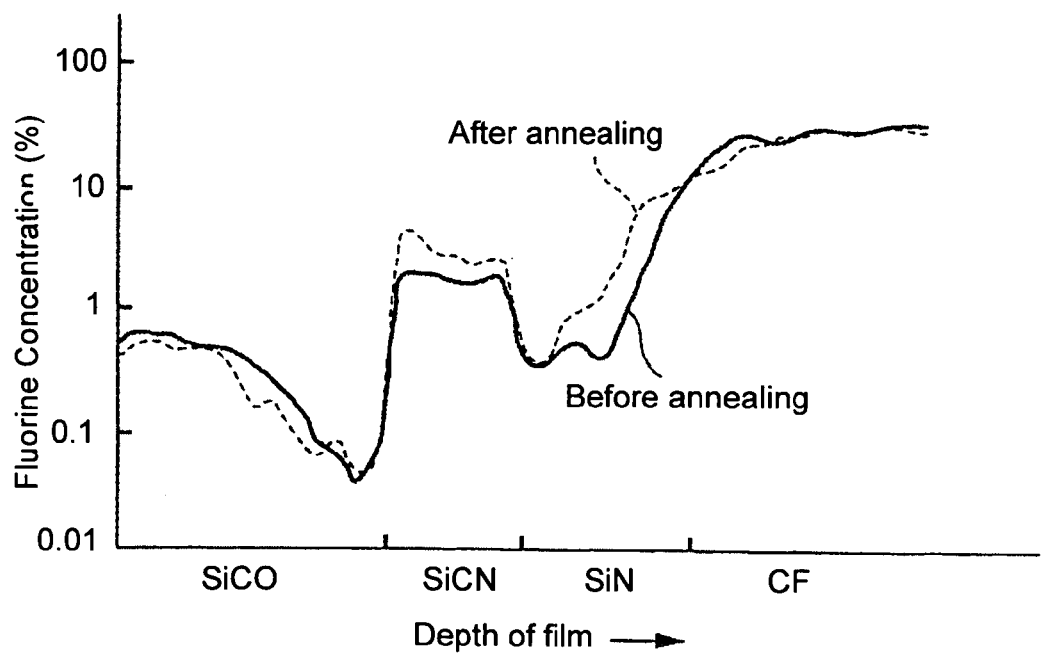
B

MANUFACTURING METHOD FOR SEMICONDUCTOR DEVICES WITH ENHANCED ADHESIVITY AND BARRIER PROPERTIES

TECHNICAL FIELD

The present invention relates to a semiconductor device using a fluorine added carbon film as an insulating film, such as an inter-layer insulating film, and a manufacturing method for the semiconductor device.

BACKGROUND OF THE INVENTION

Multilayer wiring structures have been adopted to realize the high integration of semiconductor devices. Here, as for the interlayer insulating film for insulating between each layer, it is required to decrease the relative permittivity in order to further increase the speed of device operations. Based on such a request, a fluorine added carbon film (fluorocarbon film), that is a compound of carbon (C) and fluorine (F) has been considered to be adopted as the interlayer insulating film. In the fluorine added carbon film, for example, the relative permittivity can be maintained to 2.5 or below, if the type of material gas is selected. That is, the fluorine added carbon film is an extremely effective film as an interlayer insulating film.

Meanwhile, the fluorine added carbon film is an organic film. Thus, in an etching process, the gas for etching the fluorine added carbon film also etches a resist film, which is an organic material, at the same time. For this reason, when the fluorine added carbon film is used as an insulating film, a thin film for hard mask that functions as a mask at the etching (aside from the resist film), is required to be laminated on the fluorine added carbon film. A $SiO_2$ film, or the like is known as a material of the thin film for hard mask.

The Japanese Unexamined Patent Application Publication No. 2005-302811 discloses a technique to combine a $SiO_2$ film and an oxygen added silicon carbide (SiCO) film with a low relative permittivity as a thin film for hard mask in order to suppress the increase of the relative permittivity in the entire interlayer insulating film. This SiCO film is, for example, a silicon carbide film which contains oxygen about 20 atomic %.

At this time, the inventors of the application considered to form a film that contains silicon, carbon and nitrogen (hereinafter referred as "SiCN film") layer between the fluorine added carbon film and a thin film for hard mask as a barrier layer in order to prevent the fluorine in the fluorine added carbon film from moving to the thin film for hard mask. The reason for using the SiCN film as a barrier layer here is that in a thin film having a bond of silicon and oxygen (Si—O bond), it is necessary to use the barrier layer that does not contain the bond because the Si—O bond is cut by a fluorine when the fluorine of the fluorine added carbon film enters into the film, and as a result the fluorine moves to the hard mask layer side.

By the way, when forming a SiCN film and a thin film for the hard mask on the fluorine added carbon film, for example, first the SiCN film is formed on the fluorine added carbon film using the plasma CVD (Chemical Vapor Deposition) by plasmanizing a trimethylsilane gas and an ammonia gas. Next, a SiCO film is formed on the SiCN film by plasmanizing the gas containing silicon, carbon and oxygen. Thereafter, a $SiO_2$ film is formed on the SiCO film by plasmanizing the gas containing silicon and oxygen.

However, when the SiCN film, SiCO film, and $SiO_2$ film are formed on the surface of the fluorine added carbon film according to such a process, a large amount of fluorine from the fluorine added carbon film enters into the SiCN film during these film forming processes. Thus, there is a possibility for the fluorine in the SiCN film to penetrate through the SiCN film when heated and the fluorine moves to the interface of the hard mask layer and the SiCN film during, for example, a hydrogen annealing process, in which a heat treatment at 400 degree/C is performed, after an integrated circuit is manufactured, or a heat treatment process while manufacturing an integrated circuit. And, in a case when the fluorine concentration on the interface is high, the hard mask layer peels off from the SiCN film, and this force of peeling off may result in a problem of wire breakage in a copper wiring layer.

Here, in a case when the forming process temperature for the fluorine added carbon film is high, about 380 degree/C, the amount of the fluorine scatter from the fluorine added carbon film when forming a film is large. Therefore, at the forming process of SiCN film, SiCO film, $SiO_2$ film or the like, the amount of fluorine entering into the SiCN film is relatively small, and the amount of fluorine moving to the interface of the hard mask layer and SiCN film is relatively small, thereby the film peeling of the hard mask layer is less likely to occur.

However, based on the request for attempting to reduce the total relative permittivity of the film in the semiconductor devices, there has been a demand for further decreasing the heat quantity for the overall manufacturing process of the semiconductor device. Accordingly, it has been considered to perform the film forming process for the fluorine added carbon film at the temperature about 345 degree/C. Because the large amount of fluorine remains in the fluorine added carbon film formed at such a temperature, as a result, the amount of fluorine entering into the SiCN film increases when forming the SiCN film, SiCO film and $SiO_2$ film, and the film peeling of the hard mask layer is likely to occur, which may lead to a problem.

SUMMARY OF THE INVENTION

The present invention has been made considering the above issues to effectively solve them. The objective of the present invention is to provide a technique that can suppress the penetration of a fluorine into a hard mask layer from a fluorine added carbon film and effectively suppress the peeling of the hard mask layer after a heat treatment for a semiconductor device which has the hard mask layer containing silicon and oxygen formed on the fluorine added carbon film, which is an insulating film, through a barrier layer.

The present invention is a semiconductor device including a substrate, an insulating film consisting of a fluorine added carbon film formed on the substrate, a barrier layer consisting of a silicon nitride film and a film containing silicon, carbon, and nitride formed on the insulating film, a hard mask layer having a film containing silicon and oxygen formed on the barrier layer, wherein the barrier layer is formed by laminating the silicon nitride film and the film containing silicon, carbon and nitride in this order, and functions to suppress the fluorine in the fluorine added carbon film from moving to the hard mask layer.

According to the present invention, the penetration of the fluorine from the insulating film consisting of the fluorine added carbon film to the hard mask layer, and the oxidation of the fluorine added carbon film by the oxygen used to form a thin film for the hard mask can be effectively suppressed. Therefore, in the semiconductor device of the present invention, the adhesiveness of each film is increased and the peeling of the film between the fluorine added carbon film and the barrier layer, or between the barrier layer and hard mask layer can be suppressed even when a heat treatment is performed in a subsequent process.

Preferably, the film containing silicon and oxygen in the hard mask layer is an oxygen added silicon carbide film or a silicon dioxide film.

Further, the present invention includes a manufacturing method of the semiconductor device. The method includes the steps of; forming an insulating film consisting of a fluorine added carbon film on a substrate; forming a first barrier layer consisting of a silicon nitride film on the insulating film by exposing the surface of the substrate formed with the insulating film to a plasma containing each active specie of the silicon and nitride; forming a second barrier layer consisting of a film containing silicon, carbon and nitride on the first barrier layer by exposing the surface of the substrate formed with the first barrier layer to a plasma containing each active specie of the silicon, carbon and nitride; and forming a film containing silicon and oxygen on the second barrier layer by exposing the surface of the substrate formed with the second barrier layer to a plasma containing each active specie of the silicon and oxygen.

According to the present invention, the penetration of the fluorine from the insulating film consisting of the fluorine added carbon film to the film containing silicon and oxygen (hard mask layer), and the oxidation of the fluorine added carbon film by the oxygen used to form the film containing silicon and oxygen can be effective suppressed. Therefore, in the semiconductor device of the present invention, the adhesiveness of each film is increased and the peeling of the film between the fluorine added carbon film and the first barrier layer, or between the second barrier layer and film containing silicon and oxygen (hard mask layer) can be suppressed even when the heat treatment is performed in a subsequent process.

Preferably, the film containing silicon and oxygen in the hard mask is an oxygen added silicon carbide film or silicon dioxide film.

BRIEF DESCRIPTION OF THE DRAWINGS

FIGS. 9A and 9B are characteristics diagrams showing fluorine concentrates in a laminate structure film (embodiment 1) laminating a fluorine added carbon film, SiN film, SiCN film, SiCO film and $SiO_2$ film.

DETAILED DESCRIPTION OF THE INVENTION

As one aspect of a manufacturing method for the semiconductor device pertaining to the present invention, a manufacturing method of a semiconductor device having a multilayer wiring structure and a case where forming a (n+1) th wiring layer on a nth (n is an integer not less than 1) wiring layer consisting of a metal, for example a copper is hereinafter explained.

Figure 1:
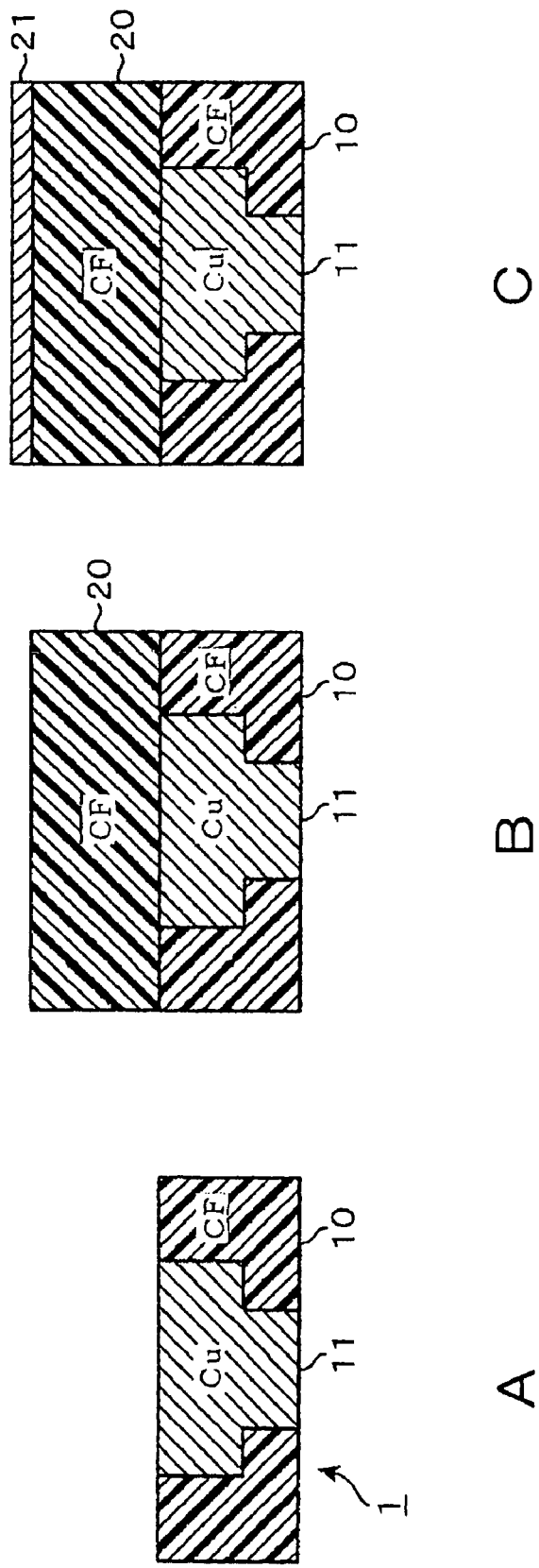
FIGS. 1A, 1B and 1C are outline explanatory diagrams illustrating formation of a fluorine added carbon film and SiN film in an embodiment of the present invention.

FIG. 1A illustrates a substrate 1 in a state where a copper wiring layer 11, that is a nth wiring layer, is formed in an insulating film 10. The substrate 1 is, for example, a semiconductor wafer. In this embodiment, an interlayer insulating film consisting of a fluorine added carbon film 20 is formed in a thickness of, for example 200 nm as shown in FIG. 1B by plasmanizing a film forming gas of a compound containing carbon and fluorine, for example, a $C_5F_8$ gas, and making the atmosphere, in which the substrate is placed, into a plasma atmosphere, thereby accumulating the active species generated from the $C_5F_8$ gas on the surface of the substrate 1.

After forming the fluorine added carbon film 20 in this way, a silicon nitride film 21 (hereinafter referred as "SiN film"), which is a first barrier layer, is formed on this fluorine added carbon film 20. This SiN film 21 is, for example a silicon film containing about 30 to 60 atomic % of nitride, and the first barrier layer referred here is a film having a function to suppress the movement of the fluorine in the fluorine added carbon film 20 to the lower layer side of the SiN film 21 as described later.

As the material gas for forming the SiN film 21, a gas containing silicon and nitride, such as a dichlorosilane ($SiH_2Cl_2$) gas and an ammonia ($NH_3$) gas are used. By plasmanizing the dichlorosilane gas and the ammonia gas, each of an active specie of the silicon and nitride accumulate on the surface of the fluorine added carbon film 20, thereby the SiN film 21 is formed as shown in FIG. 1C. At this time, a process pressure is configured to, for example, 13.3 to 40 Pa, and a wafer temperature is configured to, for example 345 degree/ C. Further, the film thickness of the SiN film 21 is preferably about 5 to 20 nm.

Figure 2:
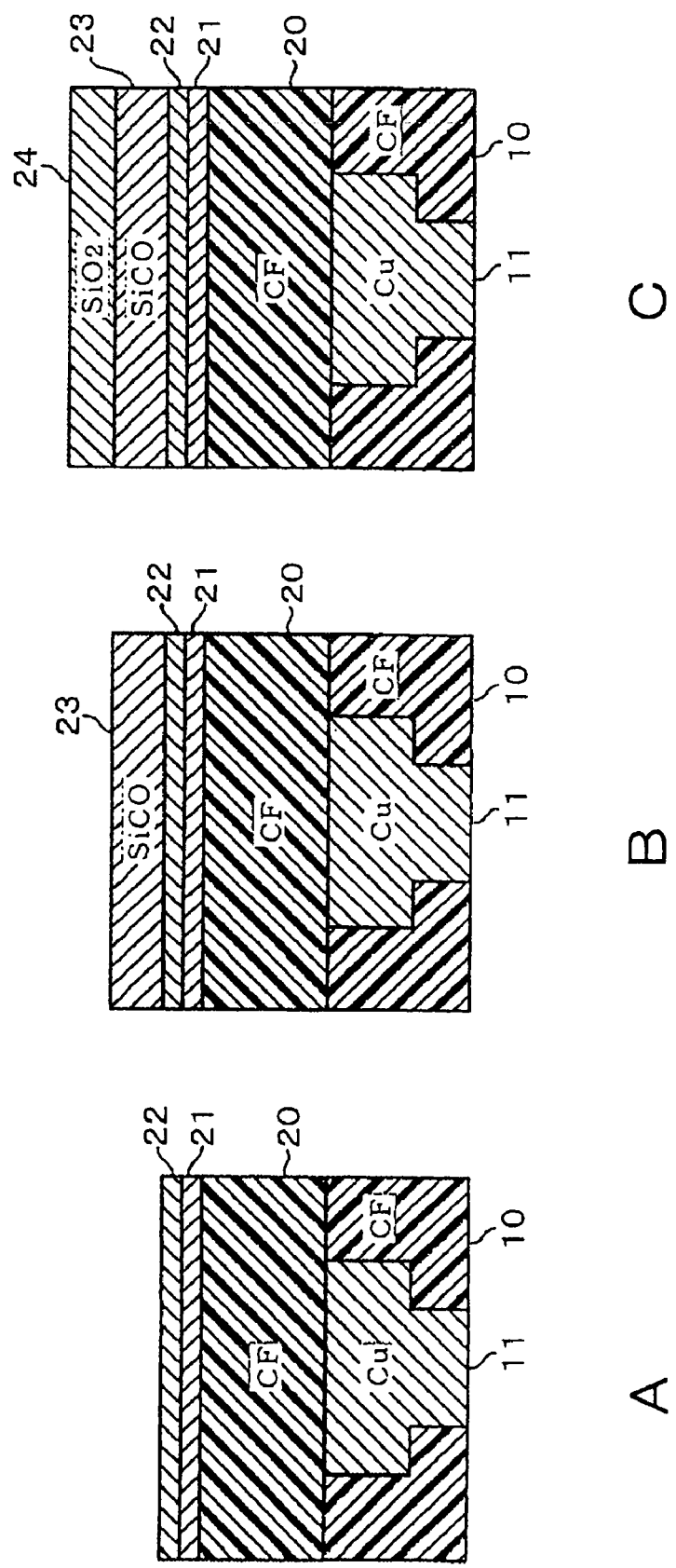
FIGS. 2A, 2B and 2C are outline explanatory diagrams illustrating formation of SiCN film, SiCO film and $SiO_2$ film in an embodiment of the present invention subsequent to FIG. 1C.

After forming the SiN film 21 on the fluorine added carbon film 20 in this way, a film 22 contains silicon, carbon and nitride (hereinafter referred as "SiCN film") which is a second barrier film and is formed as shown in FIG. 2A. This SiCN film 22 is a silicon carbide film containing, for example, about 10 to 30 atomic % of nitride, and the second barrier layer as referred here is a film having a function to suppress the movement of the oxygen used in a film forming process of a film on the upper layer side of the SiCN film 22 to the lower layer side of the SiN 22 as described later.

The material gas for forming the SiCN film 22, a gas containing silicon, carbon, and nitride, for example, a trimethylsilane ($SiH(CH_3)_3$) gas and an ammonia ($NH_3$) gas are used. By plasmanizing the trimethylsilane gas and the ammonia gas, each of an active specie of the silicon, carbon, and nitride contained in the plasma accumulate on the surface of the SiN film 21, thereby the SiCN film 22, that is the silicon nitride film, is formed as shown in FIG. 2A. At this time, a process pressure is configured to, for example, 13.3 to 40 Pa, and a wafer temperature is configured to, for example 345 degree/C. Also, the film thickness of the SiCN film 22 is preferably about 5 to 20 nm.

Consequently, a SiCO film 23, which is a first hard mask layer to be used as a hard mask in a process later, is formed.

As the material gas for forming the SiCO film 23, a gas of an organic compound containing silicon, such as a trimethylsilane gas and an oxygen ($O_2$) gas are used. By plasmanizing the trimethylsilane gas and the oxygen gas, each of an active species of the silicon, carbon, and oxygen contained in the plasma accumulate on the surface of the SiCN film 22, thereby the SiCO film 23 is formed as shown in FIG. 2B. At this time, the SiCO film 23 is formed in a film thickness of, for example, 50 nm.

Next, as shown in FIG. 2C, onto the surface of the SiCO film 23, formed is a silicon dioxide ($SiO_2$) film 24 as a second hard mask layer that is a material different from the SiCO film.

As the material gas for forming the $SiO_2$ film 24, an organic source vapor (gas), such as tetraethylorthosilicate ($Si(OC_2H_5)_4$), and an oxygen gas, is used. By plasmanizing the tetraethylorthosilicate gas and oxygen gas, each of the active species of the silicon and oxygen contained in the plasma accumulate on the surface of the SiCO film 23, thereby the $SiO_2$ film 24 is formed. At this time, the $SiO_2$ film 24 is formed in a film thickness of, for example, 150 nm.

In this embodiment, by the first barrier layer and second barrier layer, a barrier layer is formed between the fluorine added carbon film 20 and a hard mask layer. Also, by the first hard mask layer and second hard mask layer, a hard mask layer having a film containing silicon and oxygen is formed.

A semiconductor device is manufactured by forming a copper wiring layer and a via hole to the laminate structure film described above, for example applying the method described below.

Figure 3:
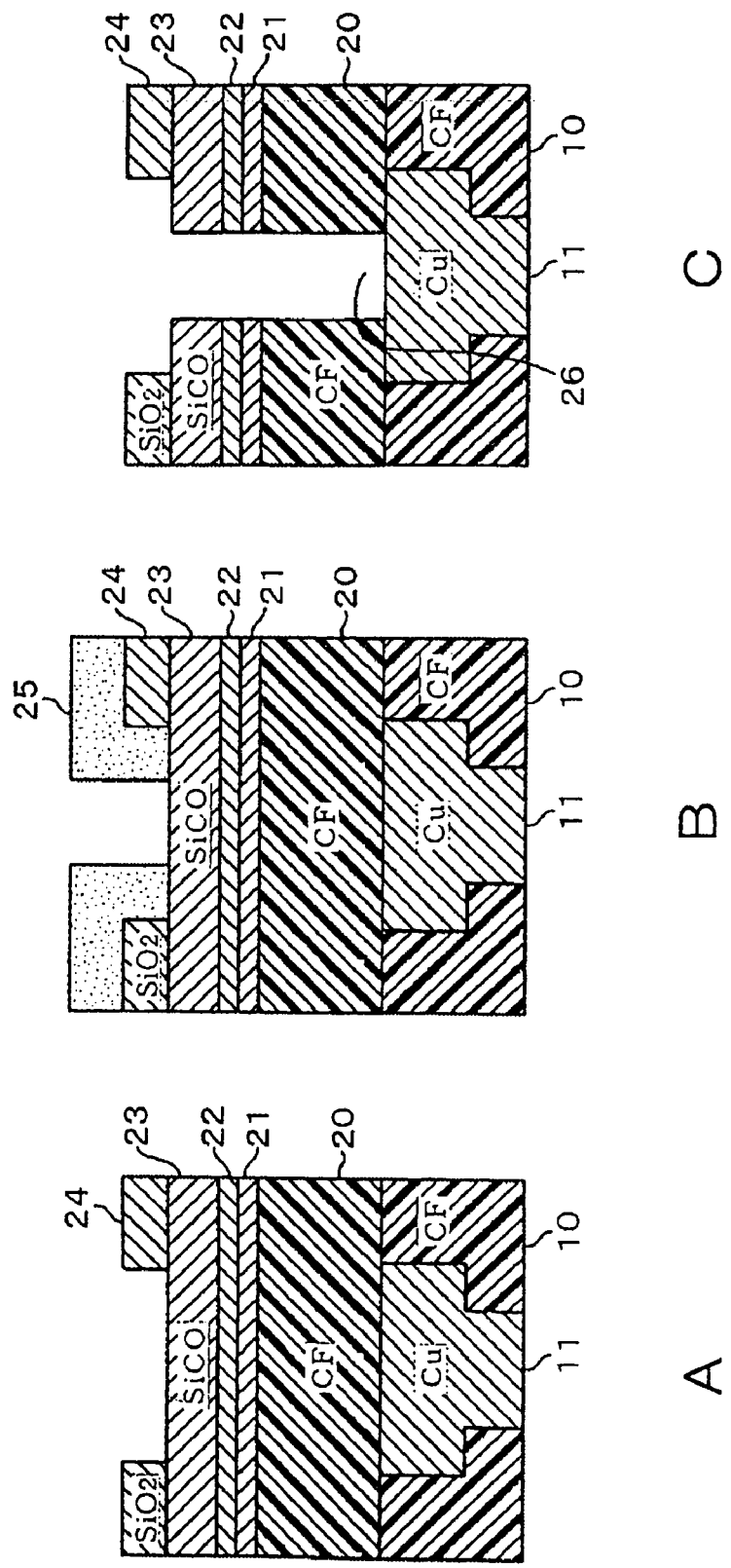
FIGS. 3A, 3B and 3C are outline explanatory diagrams of a semiconductor device for explaining a manufacturing process of the semiconductor in an embodiment of the present invention subsequent to FIG. 2C.

That is, a resist film, as well as a pattern, are formed on the $SiO_2$ film 24, then a second hard mask layer in a shape corresponding to the pattern can be obtained by etching the $SiO_2$ film 24 using the resist mask (refer to FIG. 3A).

Thereafter, a resist film 25 is formed on the surface of the wafer, as well as a second pattern, which has a smaller width than the pattern described above, is formed (refer to FIG. 3B), then a first hard mask layer can be obtained by etching the SiCO film 23 with a plasma containing, for example, an active specie of halide, using the resist mask 25. And a depression 26 is formed by etching the SiCN film 22, SiN film 21 and the fluorine added carbon film 20 with, for example, an oxygen plasma using the first hard mask layer (refer to FIG. 3C). Here, the resist film 25 is also removed at the same time by etching with the oxygen plasma because the selected ratios of the resist film 25 and fluoride added carbon film 20 are in proximity.

Figure 4:
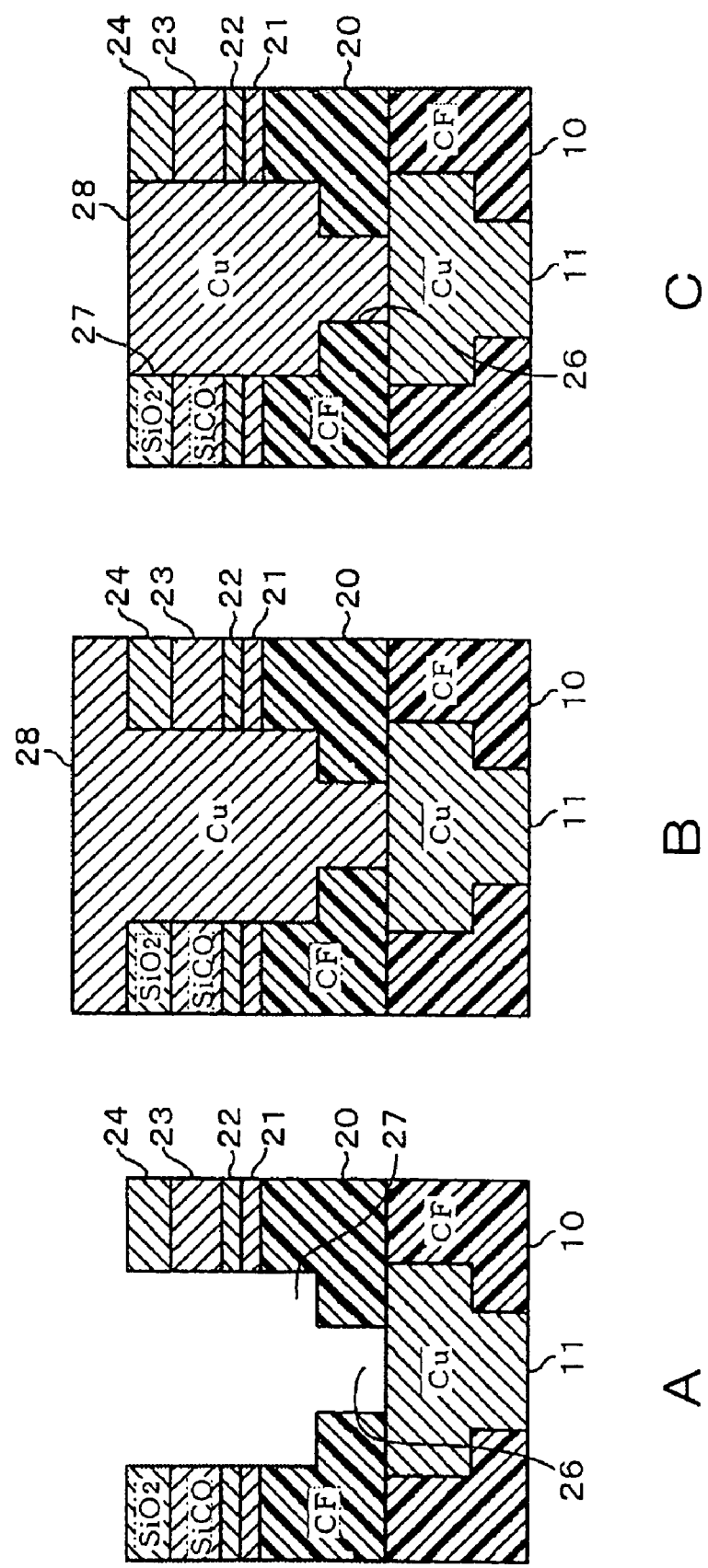
FIGS. 4A, 4B and 4C are outline explanatory diagrams of a semiconductor device for explaining a manufacturing process of the semiconductor in an embodiment of the present invention subsequent to FIG. 3C.

Further, the SiCO film 23 is etched using the second hard mask consisting of the $SiO_2$ film 24, and still further the SiCN film 22, SiN film 21, and the fluoride added carbon film 20 are etched, thereby a depression 27 having a wider width than the depression 26 is formed by the prior etching process (refer to FIG. 4A). In addition, the narrow depression 26 corresponds to the via hole, and the wider depression 27 corresponds to a wiring burying area (trench) for the circuit of the layer.

Thereafter, for example, a copper 28, which is a wiring metal, is buried as shown in FIG. 4B, and the copper 28 on the portion other than the depression 27 is removed by, for example, a polishing called CMP (Chemical Mechanical Polishing), thereby a (n+1)th copper wiring layer 28 is formed (refer to FIG. 4C).

In the embodiment described above, the SiN film 21 which is the first barrier layer, and the SiCN film 22, which is the second barrier layer is laminated between the fluoride added carbon film 20 and the hard mask layer from the bottom side in this order. This suppresses the oxidation of the fluoride added carbon film 20, as well as prevents a penetration of the fluorine in the fluorine added carbon film 20 to the hard mask layer when performing a heat treatment in latter processes.

Actually, the inventors of the claimed invention found (confirmed) from the embodiments described later that (i) the SiN film 21 has a barrier property against the fluorine, but no barrier property against the oxygen, and (ii) the SiCN film 22 has a barrier property against the oxygen, but no barrier property against the fluorine. For this reason, the SiN film 21 and the SiCN film 22 are combined as a barrier layer and forming the SiN film 21 and the SiCN film 22 on the fluorine added carbon film 20, in lamination from the bottom side in this order, thereby the fluorine diffusion from the fluorine added carbon film 20 can be suppressed by the SiN film 21, and the oxidation of the fluorine added carbon film 20 can be suppressed by the SiCN film 22. In addition, the oxidation of the fluorine added carbon film 20 results from the active species of the oxygen generated when forming the hard mask layer.

Therefore, according to the embodiment, because the SiN film 21 suppresses the fluorine movement from the fluorine added carbon film 20 to the upper layer side of the SiN film 21, the fluorine concentration at the interface of the SiCN film 22 and SiCO film 23 increases, thereby suppressing the wire breakage of the copper wiring layers 11 and 28 due to the peeling off of the hard mask layer from the SiCN film 22.

Further, because the movement of the oxygen to the fluorine added carbon film 20 is suppressed by the SiCN film 22, the occurrence of the film peeling between the fluoride added carbon film 20 and the SiN film 21 due to the oxidation of the surface of the fluorine added carbon film 20 during the forming of the hard mask layer, which then decreases adhesiveness to the SiN film 21, can also be suppressed.

Further, the SiN film 21 has a high relative permittivity of 7, however, since the SiN film 21 and the SiCN film 22 are provided in combination and each of their thicknesses is 5 nm to 20 nm, the increase in the total relative permittivity is sufficiently reduced.

As described above, in the laminate structure film of the embodiment, when the insulating film consisting of the fluorine added carbon film 20 and the hard mask layer having the film containing silicon and oxygen formed on the upper side of the insulating film are provided, the adhesiveness between the fluorine added carbon film 20, barrier layer, and the hard mask layer is increased by laminating the SiN film 21 and SiCN film 22 as a barrier layer between the insulating film and the hard mask layer from the fluorine added carbon 20 side in this order, thereby the film peeling between these layers is suppressed.

In addition, in FIG. 2C, the SiCN film 22 is laminated on the SiN film 21, and then the SiCO film 23 is formed thereon, however, SiCO film 23 may be formed after forming multiple layers of the SiN films 21 and SiCN films 22 alternatively. Further, the hard mask layer may be in any form as long as it includes the film containing the silicon and the oxygen, and a hard mask layer consisting of another material, such as a amorphous silicon carbide film (a-SiC film) may be formed between the SiCO film 23 and the $SiO_2$ form 24.

Figure 5:
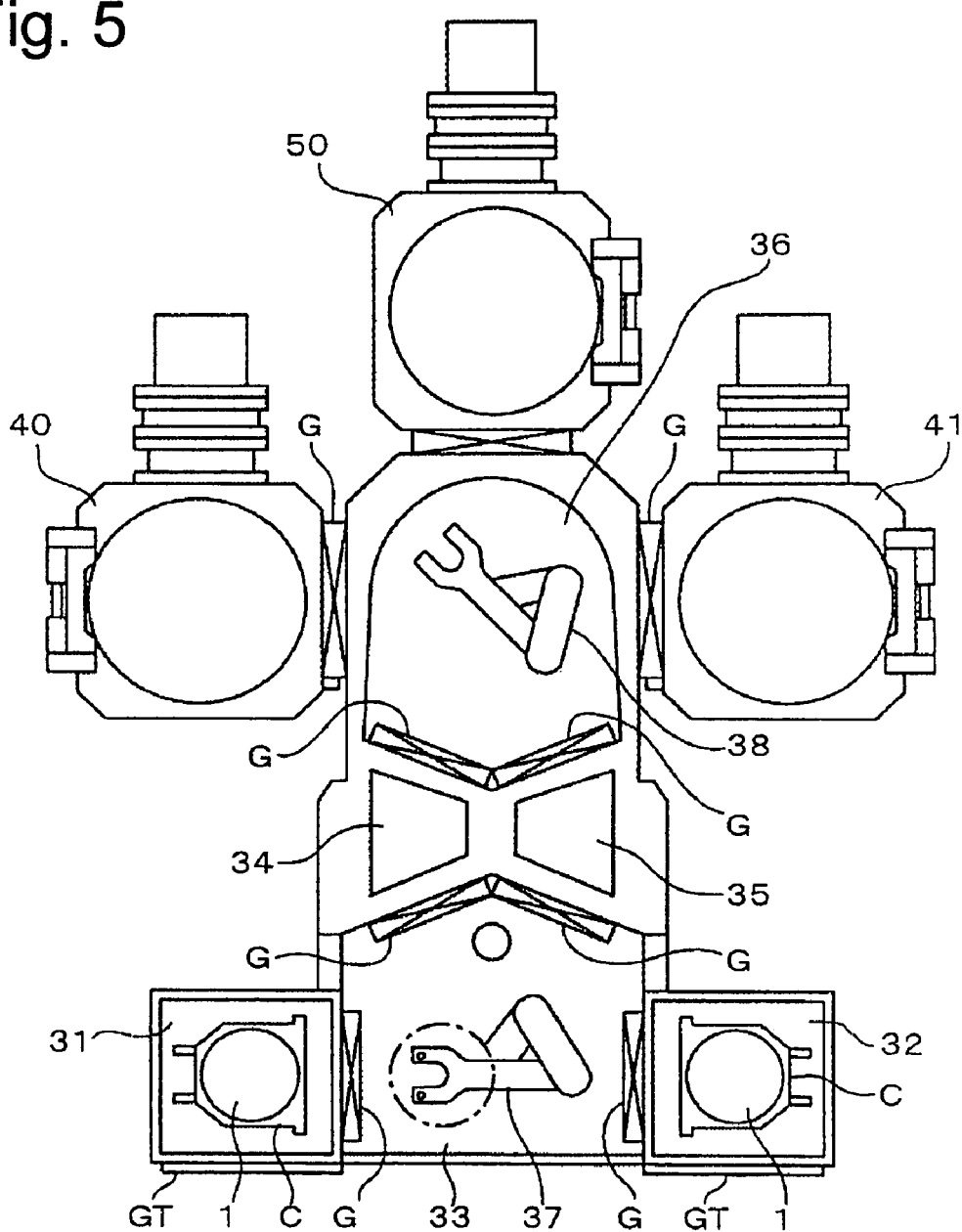
FIG. 5 is a plan view illustrating an example of a vacuum processing system used to manufacture a semiconductor device pertaining to an embodiment of the present invention.

Next, an example of a semiconductor manufacturing device to perform the manufacturing method of the semiconductor device described above will be hereinafter explained. FIG. 5 illustrates a semiconductor device for performing until the process in FIG. 2C above, that is, each of the film forming processes for the fluorine added carbon film 20, SiN film 21, SiCN film 22, SiCO film 23 and $SiO_2$ film 24. In FIGS. 5, 31 and 32 are carrier chambers, where carriers C, which are the transferring containers of wafers, are carried in from the atmospheric side through gate doors GT 33 is a first transferring chamber, 34 and 35 are the preliminary vacuum chambers, and 36 is a second transferring chamber. They are in an airtight structure and sectioned from the atmospheric side. The second transferring chamber 36, and the preliminary vacuum chambers 34 and 35 are in a vacuum atmosphere. The carrier chambers 31 and 32 and the first transferring chamber 33 are in a vacuum atmosphere, however, they may be in an inert gas atmosphere. Further, 37 is a first transferring unit and 38 is a second transferring unit.

In the second transferring chamber 36, a first film forming device 40 for forming the fluorine added carbon film 20, which is the interlayer insulating film, second film forming device 41 for forming a SiN film 21 and SiCN film 22, which are the barrier layers, and third film forming device 50 for forming a SiCO film 23 and $SiO_2$ film 24, which are hard mask layers, are connected hermetically.

In the semiconductor manufacturing device of FIG. 5, a substrate 1 in the carrier C is transferred through a route of, for example, the first transferring unit 37→preliminary vacuum chamber 34 (or 35)→second transferring unit 38→first film forming device 40. And, the fluorine added carbon film 20 is formed in the first film forming device 40. Thereafter, this substrate 1 is transferred into the second film forming device 41 through the second transferring unit 38 in a state that not exposed to the atmosphere. And, the SiN film 21 and SiCN film 22 are formed on the fluorine added carbon film 20 in this order in the second film forming device 41. Thereafter, this substrate 1 is transferred to the third film forming device 50. And, in the third film forming device 50, the SiCO film 23 and the $SiO_2$ film 24 are formed on the SiCN film 22 in this order. Thereafter, this substrate 1 is returned into the carrier C through the route opposite of that described above.

Figure 6:
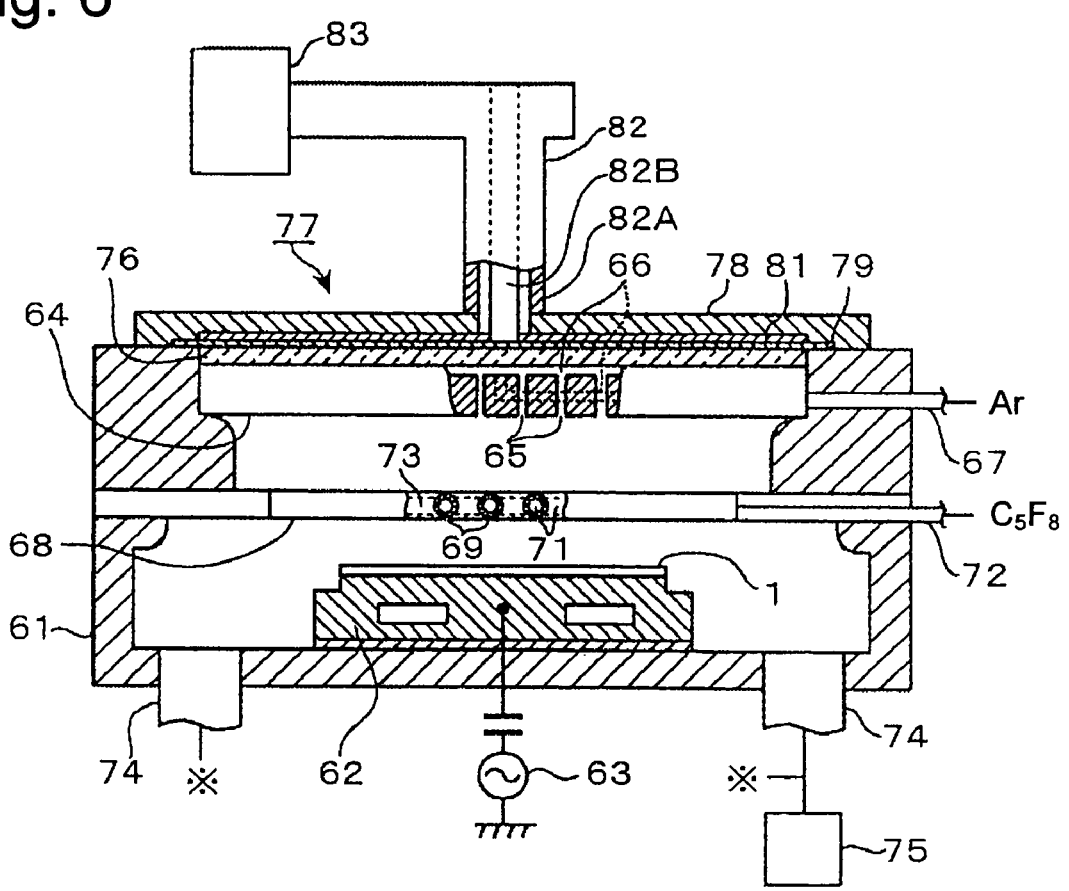
FIG. 6 is a longitudinal cross section side view illustrating an example of a plasma film forming device used to manufacture a semiconductor device pertaining to the present invention.
Figure 7:
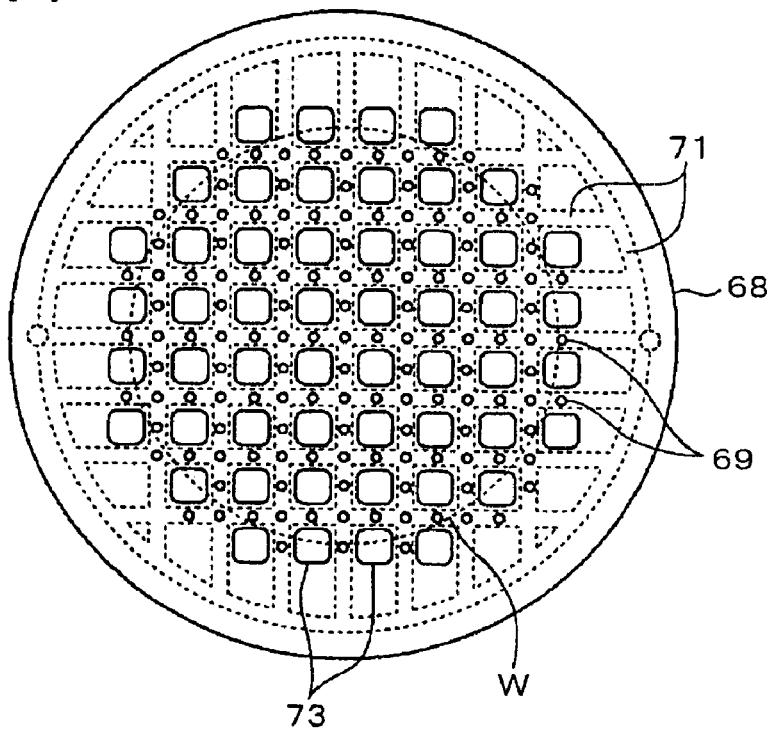
FIG. 7 is a plan view illustrating a second gas supplying section used in the plasma film forming device of FIG. 6.

Here, the first film forming device 40 for forming the fluorine added carbon film 20 is briefly explained with reference to FIGS. 6 to 8. In the figures, 61 is a processing container (vacuum chamber) and 62 is a placing table provided with a temperature control unit. Onto the placing table 62, a high-frequency wave power source 63 for bias of, for example 13.56 MHz is connected.

On the upper portion of the processing container 61, a first gas supplying section 64 consists of, for example, an alumina, and its planar figure is configured in a virtual disk shape so as to face the placing table 62. On the face facing to the placing table 62 in the gas supplying section 64, a plurality of first gas supplying holes 65 are formed. The first gas supplying holes 65 communicate with the first gas supplying channel 67 through a gas channel 66. Onto the first gas supplying channel 67, a plasma gas supplying source is connected to supply plasma gas, such as argon (Ar) gas or a krypton (Kr) gas.

Further, between the placing table 62 and the first gas supplying section 64, provided is, for example, a second gas supplying section 68 consisting of a conductor in which the planar figure is configured to a virtual disk shape. On the face facing to the placing table 62 in the second gas supplying section 68 a plurality of second gas supplying holes 69 is formed. As shown in, for example, FIG. 7, inside of the second gas supplying section 68, is formed a lattice shaped gas channel 71 communicating with the upper end side of the second gas supplying hole 69 formed in the vertical direction (the lower end of the second gas supplying hole 69 is the opening). One end side of the second gas supplying channel 72 is connected to this gas channel 71. Also, onto the second gas supplying section 68, a plurality of openings 73 are formed so as to penetrate the second gas supplying section 68 in the thickness direction. The openings 73 pass the plasma into the space on the lower side of the second gas supplying section 68. The openings 73 are, for example, formed between the adjacent gas channel 71.

Other end side of the second gas supplying channel 72 is connected to a supplying source of a $C_5F_8$ gas, which is the material gas described above (not shown). By this, the $C_5F_8$ gas, that is the material gas described above, is circulated to the gas channel 71 through the second gas supplying channel 72, and uniformly supplied to the space on the lower side of the second gas supplying section 68 through the second gas supplying hole 69. In addition, 74 in the figure is an exhaust pipe that is connected to a vacuum exhaust unit 75.

On the upper side of the first gas supplying section 64, provided is a cover plate 76 consisting of a dielectric body, such as alumina, and an antenna section 77 provided on the upper side of the cover plate 76 so as to closely fit the cover plate 76. As shown in FIG. 8, this antenna section 77 is provided with a flat antenna body 78, which is substantially planar and comprises a circular form and the lower face side is open, and a disk shape planar antenna member (slit plate) 79 which is provided so as to block the opening of the antenna body 78. The antenna body 78 and planar antenna member 79 consist of a conductor and a circular form waveguide, which is flat and hollow. Also, a plurality of slits are formed on the planar antenna member 79.

Further, between the planar antenna member 79 and antenna body 78, provided is a retardation plate 81, which consists of a low loss dielectric material, such as alumina, silicon oxide, or silicon nitride. This retardation plate 81 shortens the wave length of the microwave, thereby shortening the guide wavelength in the waveguide. In this embodiment, the antenna body 78, planar antenna member 79, and retardation plate 81 consist of a radial line slit antenna.

In the antenna section 77 configured in this way, the planar antenna member 79 is arranged so as to closely contact the cover plate 76 and is fixed to the processing container through a sealing member (not shown). Meanwhile, the antenna section 77 configured in this way is connected to an external microwave generating unit 83 by the coaxial waveguide 82 and is supplied with a microwave in frequency of 2.45 GHz or 8.4 GHz. At this time, the external waveguide 82A of the coaxial waveguide 82 is connected to the antenna body 78, the center conductor 82B penetrates the opening formed on the retardation plate 81 and is connected to the planar antenna member 79.

Figure 8:
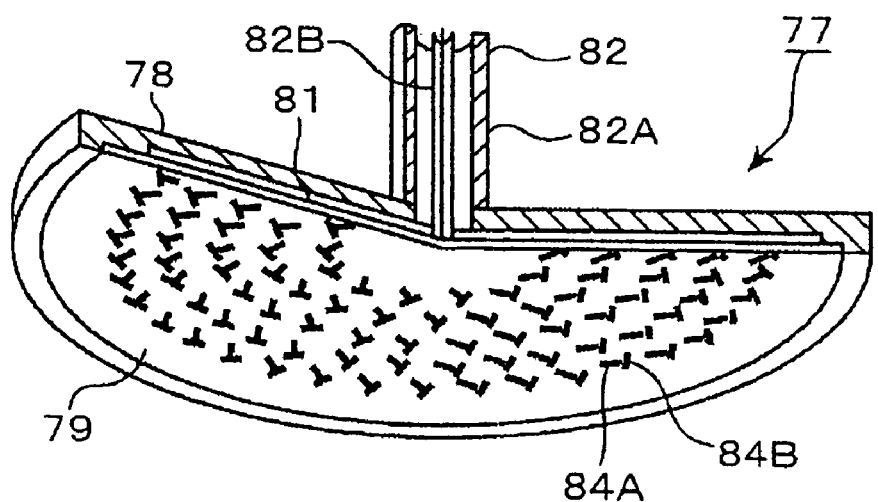
FIG. 8 is a perspective view showing a partial cross section of an antenna portion used in the plasma film forming device of FIG. 6.

The planar antenna member 79 consists of a copper plate in the thickness of, for example about 1 mm, and a plurality of slits 84 are formed for generating, for example, a circular polarization as shown in FIG. 8. Specifically explaining the arrangement of the slits 84, pairs of slits 84A and 84B are arranged in substantially a T shape with slight spacing, and are arranged in, for example, a concentric circle form or a spiral form along a circumferential direction. In addition, a set (a pair) of slits may be arranged in a virtually slanted form with a slight spacing. By arranging the pairs of slits 84A and 84B in a relationship of alternately bisecting at virtually a right angle, a circular polarized wave containing two orthogonal polarized waves is radiated. At this time, by arranging the one pair of slits 84A and 84B with a spacing corresponding to the wavelength of the microwave compressed by the retardation plate 81, the microwave is radiated as a virtually planar wave by the planar antenna member 79.

Next, explained is an example of a film forming process of the fluorine added carbon film 20 performed by the film forming device 40 described above. First, the substrate 1 is carried into the processing container 61 and placed on the placing table 62. Next, inside the processing container 61 is vacuumed to a predetermined pressure. A plasma gas, such as Ar gas, is supplied from the first gas supplying section 64 into the processing container 61 at a predetermined flow rate, such as 200 sccm, as well as a $C_5F_8$ gas is supplied from the second gas supplying section 68, that is a material gas supplying section, into the processing container 61 at a predetermined flow rate, such as 100 sccm. And, inside the processing container 61 is, for example, adjusted to a process pressure of 10.6 Pa (80 mTorr) and maintained, and the wafer temperature is configured to 345 degree/C.

Meanwhile, as a high frequency wave (microwave) of 2.45 GHz, 3000 W is supplied from the microwave generation unit 83, this microwave propagates through the coaxial waveguide 82 in a TM mode or TE mode. And, while the microwave is radially propagated from the center portion of the planar antenna member 79 to the circumference area through the center conductor 82B of the coaxial waveguide, the microwave is emitted from the slits 84A and 84B to the processing space on the lower side of the first gas supplying section 64 through the cover plate 76 and the first gas supplying section 64.

At this time, since the slit 84 is formed (arranged) as described above, the circular polarized wave is emitted virtually evenly from the entire face of the planar antenna member 79. This uniformizes the electric field density in this space on the lower side. And by the energy of this microwave, for example, a high density uniform argon gas plasma is exited in the space between the first gas supplying section 64 and the second gas supplying section 68. Meanwhile, the $C_5F_8$ gas emitted from the second gas supplying section 68 is activated by contacting the plasma described above flown into the opening section 73 from the upper side. The inter-layer insulating film consisting of the fluorine added carbon film 20 is formed by the accumulation of the active species generated from this $C_5F_8$ gas on the surface of the substrate 1.

At this time, the Ar gas is used as a noble gas for generating the plasma in the example described above, however, other noble gases, such as a helium (He) gas, neon (Ne) gas, krypton (Kr) gas, xenon (Xe) gas may also be used. Also, as a usage of the fluorine added carbon film, it may be another insulating film and not limited to the interlayer insulating film. As the material gas of the fluorine added carbon film, a $CF_4$ gas, $C_2F_6$ gas, $C_3F_8$ gas, $C_3F_9$ gas and $C_4F_8$ gas may be used, and it is not limited to the $C_5F_8$ gas.

As the second film forming device 41 for forming the SiN film 21 and the SiCN film 22, a device having the same configuration as the film forming device 40 described above may be used. In this case, a plasma gas, such as Ar gas, supplying source is connected to a first gas supplying channel 67 and second gas supplying channel 72 is connected to a disilane gas supplying source and nitride gas supplying source, and trimethylsilane gas supplying source.

In such a second film forming device 41, the substrate 1 with the fluorine added carbon film 20 preformed is carried into the processing container 61, and then inside the processing container 61 is vacuumed to a predetermined pressure. And, the forming of the SiN film 21, that is the first barrier layer, is performed. In the film forming process, first, a plasma gas, such as Ar gas, is supplied from the first gas supplying section 64 into the processing container 61 at a predetermined flow rate, such as 600 sccm, as well as, a disilane gas and nitride gas is supplied from the second gas supplying section 68 into the processing container 61 at a predetermined flow rate, such as 6 sccm and 50 sccm respectively. And, inside the processing container 61 is adjusted and maintained to, for example a process pressure of 16 Pa, and the wafer temperature on the placing table 62 is configured to 345 degree/C. Meanwhile, by the high frequency wave (microwave) of 2.45 GHz, 1500 W supplied from the microwave generating unit 83, the Ar gas is plasmanized by the energy of this microwave, and the disilane gas and nitride gas are excited by this plasma, thereby the SiN film 21 is formed on the fluorine added carbon film 20.

Consequently, forming of the SiCN film 22, that is the second barrier layer, is performed. In the film forming process, for example, the disilane gas is switched to the trimethylsilane gas, the trimethylsilane gas is supplied from the second gas supplying section 68 into the processing container 61, for example at 60 sccm, and the nitride gas is supplied, for example at 50 sccm. The rest is the same as the film forming process described above. At this time, the Ar gas is plasmanized by the microwave energy, and the trimethylsilane gas and the nitride gas are exited by this plasma, thereby the SiCN film 22 is formed on the SiN film 21.

In addition, as the material gas of the SiN film 21, a combination of a dichlorosilane gas and ammonia gas, and a combination of a silane gas and nitride gas may be used. Further, as the material gas of the SiCN film 22, a combination of a trimethylsilane gas and ammonia gas, and a combination of a trimethylsilane gas and $N_2O$ gas may be used.

As the third film forming device 50 for forming the SiCO film 23 and the $SiO_2$ film 24, a device having the same configuration as the film forming device 40 described above may be used. In such a case, the first gas supplying channel 67 is connected to a plasma gas, such as a Ar gas supplying source and an oxygen gas supplying source, and the second gas supplying channel 72 is connected to a trimethylsilane gas supplying source and a tetraethylorthosilicate gas supplying source.

In such a third film forming device 50, the substrate 1 with the first and second barrier layers already formed is carried into the processing container 61, then the plasma gases, such as Ar gas and oxygen gas are supplied from the first gas supplying section 64 into the processing container 61 at a predetermined flow rate of, for example, 1000 sccm and 200 sccm respectively, as well as a trimethylsilane gas is supplied from the second gas supplying section 68 into the processing container 61 at a predetermined flow rate of, for example 200 sccm. And the inside of the processing container 61 is adjusted and maintained to a process pressure of, for example, 33.3 Pa (250 mTorr), and the wafer temperature on the placing table 62 is configured to 345 degree/C. Meanwhile, by the supply of the high frequency wave of 2.45 GHz, 1500 W from the microwave generating unit 83, the Ar gas is plasmanized by the energy of this microwave, and the oxygen gas and the trimethylsilane gas are exited by this plasma, thereby the SiCO film 23, that is the first hard mask layer, is formed on the SiCN film 22.

Consequently, for example, the trimethylsilane gas is switched to tetraethylorthosilicate gas, and the tetraethylorthosilicate gas is supplied from the second gas supplying section 68 into the processing container 61, for example at 100 sccm, thereby the $SiO_2$ film, which is the second hard mask layer, is formed. At this time, the Ar gas is plasmanized by the microwave energy, and the oxygen gas and the tetraethylorthosilicate gas are exited, thereby the $SiO_2$ film 24 is formed on the SiCO film 23.

In the semiconductor manufacturing device of the embodiment explained above, the second transferring chamber 36 is configured to a vacuum atmosphere, and the first to third film forming chambers 40, 41, and 50 are connected to this transferring chamber 36, thus the substrate 1 formed with the fluorine added carbon film 20 in the first film forming chamber 40 can be transferred to the second film forming chamber 41 without exposing to the atmosphere and the SiN film 21 can be formed on the fluorine added carbon film 20 in the second film forming chamber 41. Therefore, during the film forming process of the SiN film 21, the oxygen in the atmosphere is prevented from entering into the SiN film 21 or the fluorine added carbon film 20, and the oxidation of the fluorine added carbon film 20 can also be prevented.

In this way, the film forming process of the fluorine added carbon film 20 and the film forming process of the SiN film 21 are required to be performed in the atmosphere in which the oxygen does not enter. It is, therefore, preferable to perform these film forming processes in the device, in which a plurality of film forming chambers are connected to a transferring chamber configured to a vacuum atmosphere as the semiconductor manufacturing device described above. However, the film forming process of the SiN film 21 and the film forming process of the SiCN film 22 may be performed in separate film forming chambers in the semiconductor manufacturing device. Further, the film forming process of the SiCN film 22, the film forming process of the SiCO film 23, and the film forming process of the $SiO_2$ film 24 may be performed in separate film forming chambers, other than the film forming chambers of the semiconductor manufacturing device.

EXPLANATION OF THE EMBODIMENT

A. Forming of the Fluorine Added Carbon Film, Barrier Layer, and Hard Mask Layer Embodiment 1

In the semiconductor manufacturing device, the fluorine added carbon film 20 is formed in a thickness of 200 nm on the silicon bare wafer that is a substrate, using the film forming device 40 shown in FIG. 5.

Next, SiN film 21 in a thickness of 10 nm and the SiCN film 22 in a thickness of 8 nm are formed in this order on the fluorine added carbon film 20 as barrier layers using the second film forming device 41.

Thereafter, SiCO film 23 in a thickness of 50 nm and $SiO_2$ film 24 in a thickness of 150 nm are formed in this order on the SiCN film 22 as hard mask layers using the third film forming device 50.

The process conditions for each film are the same as the conditions described above.

Comparative Example 1

Without forming the SiN film 21, only the SiCN film 22 in a thickness of 10 nm is formed on the fluorine added carbon film 20 as a barrier layer.

The film forming is performed with the same conditions as the embodiment 1 except for the condition described above (refer to FIG. 10).

Comparative Example 2

Without forming the SiCN film 22, only the SiN film 21 in a thickness of 8 nm is formed on the fluorine added carbon film 20 as a barrier layer.

The film forming is performed with the same conditions as the embodiment 1, except for the condition described above (refer to FIG. 11).

B. Examination of the Adhesiveness

An annealing process is performed to each of the substrates for the embodiment 1, comparative examples 1 and 2 at 400 degree/C for 60 minutes under the ambient pressure and nitrite atmosphere. Thereafter, the surfaces of these substrates are visually checked, and the condition of film peeling is examined by attaching a piece of tape.

As a result, a number of discoloration ranges are seen in the comparative examples 1 and 2 due to the bubbles generated from the membrane. Also, in the comparative example 1, the film peeling is significant at the interface of the SiCN film 22 and the SiCO film 23, and in the comparative example 2, small peelings are seen in the interface of the fluorine added carbon film 20 and the SiN film 21.

On the other hand, in the embodiment 1, there is no discoloration range like the comparative example 1, nor is there film peeling at the interface of the fluorine added carbon film 20 and the SiN film 21, or the interface of the SiCN film 22 and the SiCO film 23.

Therefore, it can be understood that by providing the lamination of the SiN film 21 and the SiCN film 22 as the barrier layer between the fluorine added carbon film 20 and the SiCO film 23, which consists of the hard mask layer, the adhesiveness increases between the fluorine added carbon film 20 and the barrier layer, and the barrier layer and the hard mask layer.

C. Examination on the Barrier Property Against the Fluorine

As for the substrate of the embodiment 1, the fluorine concentration profile in the laminate body is examined by the SIMS (Secondary Ion Mass. Spectroscopy) method at before and after the annealing process. Also for the substrates of the comparative examples 1 and 2, the fluorine concentration profiles in the laminate bodies are examined at before and after the annealing process.

Figure 10:
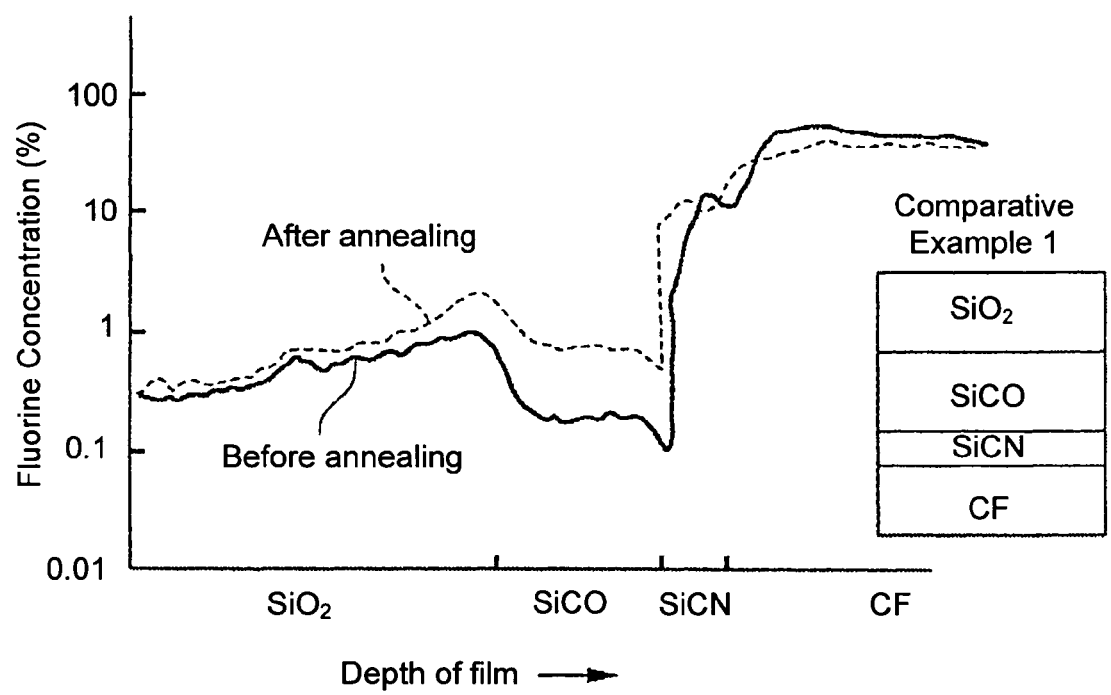
FIG. 10 is a characteristics diagram showing fluorine concentrate in a laminate structure film (embodiment 1) laminating a fluorine added carbon film, SiCN film, SiCO film and $SiO_2$ film.

The result of the embodiment 1 is shown in FIGS. 9A and 9B, the result of the comparative example 1 is shown in FIG. 10. FIG. 9B shows a proximity data of the SiN film 21 and the SiCN film 22 in the FIG. 9A. In the FIGS. 9A, 9B and 10, the vertical axis indicates the fluorine concentration, and the horizontal axis indicates the depth of the film. The solid line indicates the data before the annealing process and the dotted line indicates the data after the annealing process.

In the profile of the comparative example 1 shown in FIG. 10, the fluorine concentration in the SiCN film 22 and SiC film 23 after the annealing process is higher compared to before the annealing process, and the fluorine concentration in the SiCN film 22 around the interlayer of the SiCN film 22 and SiCO film 23 is higher by about 10 atomic %. This confirms that the fluorine isolated from the fluorine added carbon film 20 by the annealing process passes through the SiCN film 22 and reaches to the SiCO film 23. That is, it is confirmed that the SiCN film 22 barely functions as the barrier layer to prevent the diffusion of the fluorine from the fluorine added carbon film 20. As for the peeling of the film at the interface of the SiCN film 22 and SiCO film 23 occurring in the tape test of the comparative example 1, it is speculated that this resulted from the high fluorine concentration in this range.

Meanwhile, the profile of the embodiment 1 shown in FIGS. 9A and 9B, the fluorine concentration of the SiN film 21 and SiCN film 22 after the annealing process is slightly higher compared to before the annealing process, however, the fluorine concentration in the SiCN film 22 around the interface of the SiCN film 22 and SiCO film 23 is about 0.5 atomic %, which showed a little change before and after the annealing process. Rather, the fluorine concentration in the SiCO film 23 decreases after the annealing process. This confirms that even if the fluorine is isolated from the fluorine added carbon film 20 by the annealing process, the fluorine that passes through the SiN film 21 and reaches the SiCN film 22 is in a very low amount. It is further confirmed that most of the fluorine does not pass through the SiCN film 22. That is, it can be understood that the SiN film 21 functions as the barrier layer, which prevents the penetration of the fluorine from the fluorine added carbon film 20 to another film. Further, it is confirmed that the diffusion of the fluorine from the fluorine added carbon film 20 to the SiCO film 23 (hard mask layer) can certainly be prevented by using the SiN film 21 as the first barrier layer and laminating the SiCN film 22 on the SiN film 21 as the second barrier layer.

Further, the fluorine concentration in the SiN film 21 in the laminate layer structure film is measured when forming the laminate structure film of the comparative example 2 and the result was about 0.6 atomic %. Based on this, it is confirmed that the movement of the fluorine to the SiN film 21 during the forming process of the SiN film 21 hardly occurs. Further, the fluorine concentration in the SiCN film 22 in the laminate layer structure film is measured when forming the laminate structure of the embodiment 1 and the result was about 1 atomic %. Based on this, it is also confirmed that the movement of the fluorine to the SiCN film 22 during the forming process of the SiCN film 22 hardly occurs. Based on the results, it is conformed that the SiN film 21 prevents the diffusion of the fluorine from the fluorine added carbon film 20 to the upper layer side of the SiN film 22.

D. Examination on the Barrier Property Against Oxygen

Figure 11:
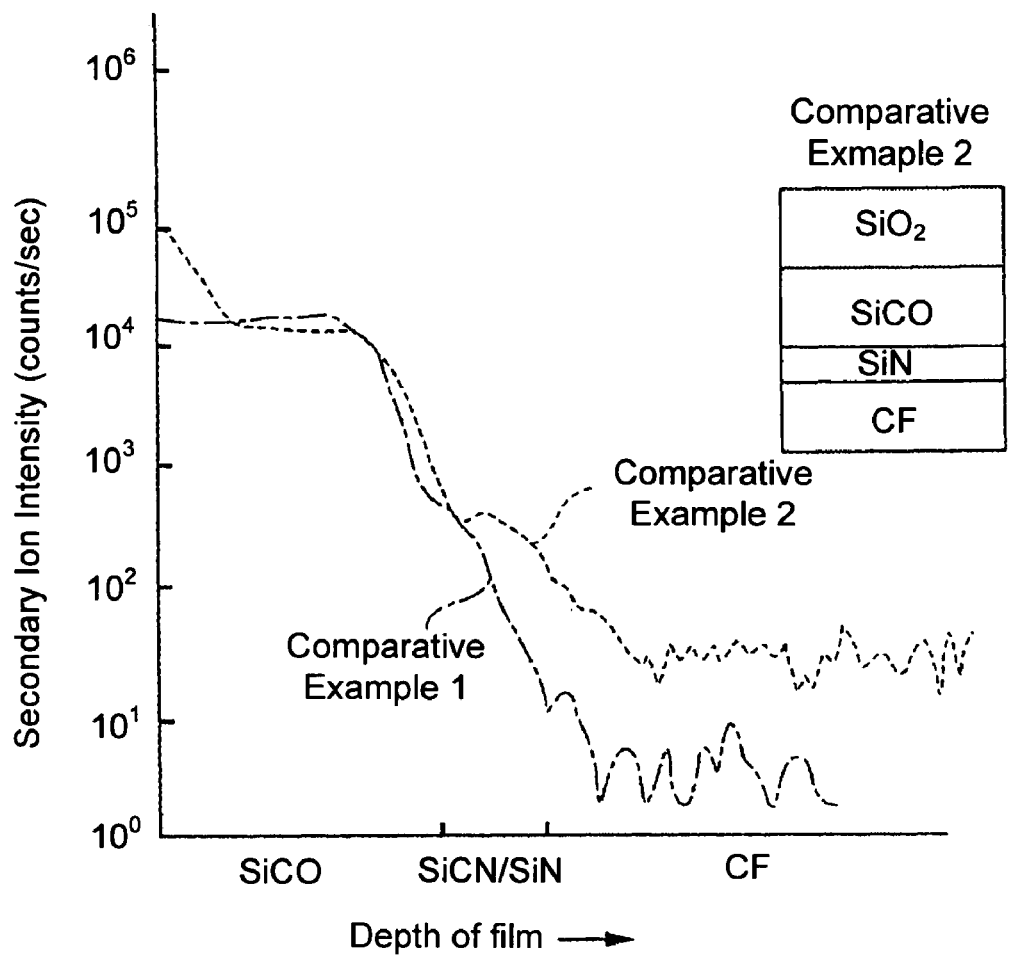
FIG. 11 is a characteristics diagram showing oxygen ion strength in the laminate structure film of the comparative example 1 and oxygen ion strength in the laminate structure film of the comparative example 2 laminating a fluorine added carbon film, SiN film, SiCO film, and $SiO_2$ film.
Figure 12:
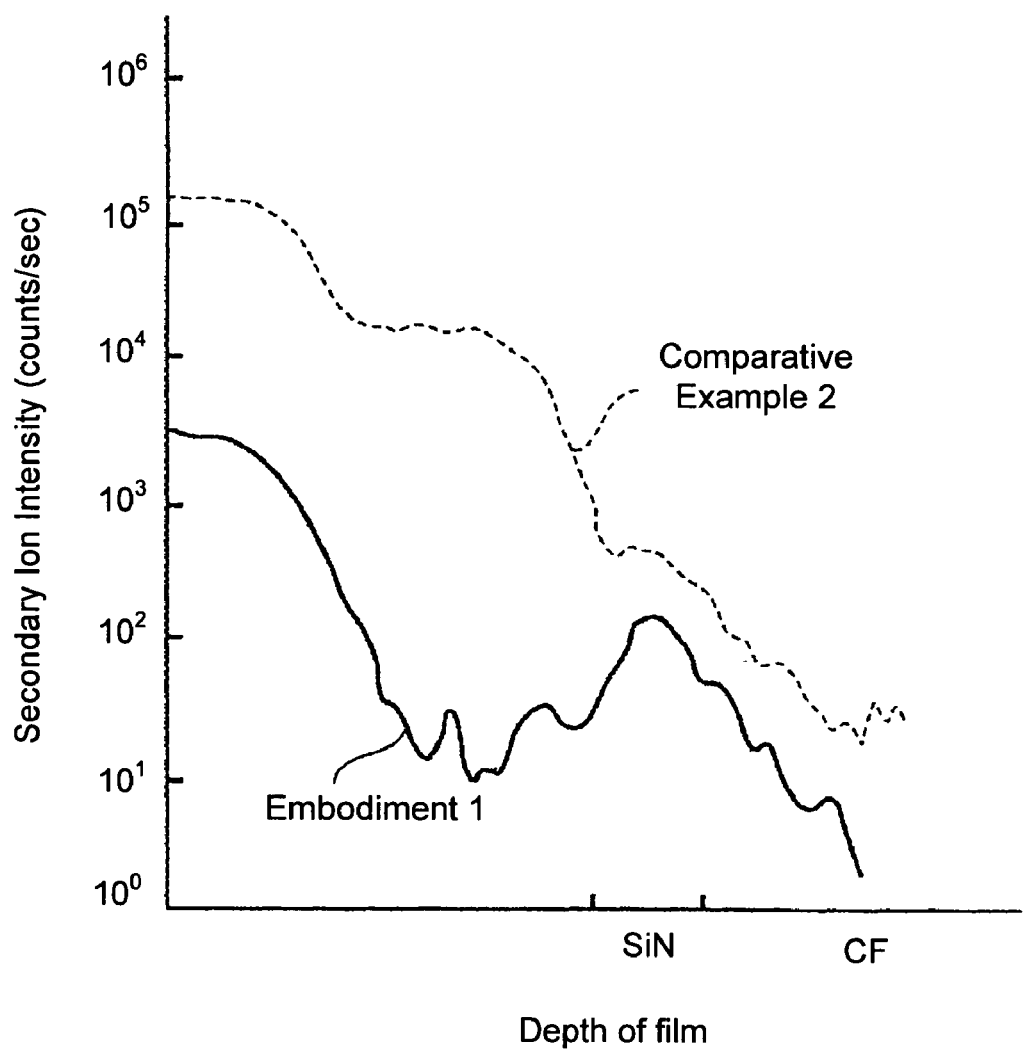
FIG. 12 is a characteristics diagram showing oxygen ion strength in the laminating structure film of the embodiment 1 and the oxygen ion strength in the laminating structure film of the comparative example 2.

As for the embodiment 1, comparative examples 1 and 2, the profile for the oxygen concentration in the laminated structure film is examined as follows: Perform a mass spectrometry of the secondary ion which is emitted from spattering by irradiating an ion beam on the surface of the laminate structure film by the SIMS, and the profile of the oxygen concentration in the laminate structure is examined using the secondary ion strength as an index. The results for the comparative examples 1 and 2 are shown in FIG. 11, and the results for the embodiment 1 and comparative example 2 are shown in FIG. 12. In FIGS. 11 and 12, the vertical axis shows the secondary ion strength (counts/sec) and the horizontal axis shows the depth of the film (nm). Also in FIGS. 11 and 12, the solid line indicates the data of the embodiment 1, the dashed-dotted line indicates the data of the comparative example 1, and the dotted line indicates the data of the comparative example 2.

According to the profile shown in FIG. 11, the oxygen ion strength in the fluorine added carbon film 20 of the comparative example 2 is confirmed to be about 50 (counts/sec). Based on this, in can be understood that the SiN film 21 hardly has the barrier property against the oxygen generated during the forming process of the hard mask layer because the active specie of the oxygen used in the forming process of the hard mask layer reaches to the fluorine added carbon film 20 through the SiN film 21, which is the barrier layer of the comparative example 2. It is speculated that the film peeling at the interface of the fluorine added carbon film 20 and the SiN film 21 occurring in the tape test of the comparative example 2 results from the oxidation of the fluorine added carbon film 20 by the active specie of the oxygen.

Meanwhile, the oxygen ion strength in the fluorine added carbon film 20 on the comparative example 1 is 10 (counts/sec) or below, which confirms that the oxygen hardly exists in the fluorine added carbon film 20. Therefore, it is confirmed that the active specie of the oxygen used in the forming process of the hard mask layer does not transmit through the SiCN film 22, which is the barrier layer of the comparative example 1. As a result, it can be understood that the SiCN film 22 has the barrier property against the oxygen generated during the forming process of the hard mask layer. Namely, it can be understood that the oxidation of the fluorine added carbon film 20 at the forming process of the hard mask layer can be suppressed by providing the SiCN film 22 between the fluorine added carbon film 20 and the hard mask layer.

Further, according to the profile shown in FIG. 12, by comparing the embodiment 1, which is provided with the SiN film 21 and SiCN film 22 as the barrier layer, to the comparative example 2, which is provided only with the SiN film 21 as the barrier layer, it is confirmed that the oxygen ion strength peak at the interface of the SiN film 21 and the fluorine added carbon film 20 is smaller compared to the comparative example 2 by laminating the SiCN film 22 on the SiN film 21 as shown in embodiment 1. From this result, it is also understood that the SiCN film 22 effectively functions as the barrier layer for the oxygen in the laminated structure film on the embodiment 1, thereby the oxidation of the fluorine added carbon film 20 at the forming process of the hard mask layer is surely suppressed, which results in an improvement of the adhesiveness and prevention of the film peeling.

E. Mechanism of the Fluorine to Enter into the Hard Mask Layer

Based on the embodiments above, the inventors of the present invention speculate the mechanism of the fluorine to enter into the hard mask layer of the fluorine added carbon film 20 as follows:

First, the SiCN film 22 is formed on the surface of the fluorine added carbon film 20 when forming the laminated layer structure film of the comparative example 1. At this time, the fluorine in the fluorine added carbon film 20 enters into the SiCN film 22 and the SiCNF is generated. Next, onto this surface, the SiCO film 23 is formed and the $SiO_2$ film 24 is formed thereafter. In the forming process of these films 23 and 24, an oxygen plasma is used. At this time, the active specie of the oxygen passes through the SiCO film 23 and enters into the SiCN film 22. Then the oxygen attacks the SiCNF existing there, and the nitride breaks off. For this reason, the fluorine is in a state that is easy to isolate as a result. And, when the annealing process is performed in a post-process, this fluorine isolates and enters into the hard mask layer.

In response, when the lamination of the SiN film 21 and SiCN film 22 is provided as the barrier layer, first there is hardly any fluorine that moves to SiN film 21 from the fluorine added carbon film 20 in the forming process of the SiN film 21. For this reason, the fluorine is prevented from entering into the SiCN film 22 in the subsequent forming process of the SiCN film 22. That is, the generation of the SiCNF in the SiCN film 22 is suppressed. Therefore, it is speculated that although the oxygen attacks or the like may occur to the SiCN film 22 in the forming process of the hard mask layer, the diffusion of the fluorine to the hard mask layer is suppressed due to a very low fluorine content in the SiCN film 22.

What is claimed is:

1. A method for manufacturing a semiconductor device, the method comprising the steps of;

forming an insulating film comprising a fluorine added carbon film on a substrate;

forming a first barrier layer comprising a silicon nitride film on the insulating film by exposing a surface of the substrate formed with the insulating film to a plasma containing each active specie of a silicon and a nitride;

forming a second barrier layer comprising a film containing silicon, carbon, and nitride on the first barrier layer by exposing a surface of the substrate formed with the first barrier layer to a plasma containing each active specie of the silicon and a carbon; and forming a film containing silicon and oxygen on the second barrier layer by exposing a surface of the substrate formed with the second barrier layer to a plasma containing each active specie of the silicon and an oxygen.

2. The method for manufacturing the semiconductor device according to claim 1, wherein the film containing the silicon and oxygen is an oxygen added silicon carbide film or a silicon dioxide film.

* * * * *